United States Patent
Sato et al.

(10) Patent No.: US 9,295,132 B2
(45) Date of Patent: Mar. 22, 2016

(54) LIGHT EMITTING DEVICE AND METHOD FOR MANUFACTURING A LIGHT EMITTING DEVICE

(71) Applicant: Nichia Corporation, Tokushima (JP)

(72) Inventors: Takashi Sato, Yokohama (JP); Satoshi Shirahama, Yokohama (JP)

(73) Assignee: NICHIA CORPORATION, Anan-Shi (JP)

(*) Notice: Subject to any disclaimer, the term of this patent is extended or adjusted under 35 U.S.C. 154(b) by 228 days.

(21) Appl. No.: 13/779,070

(22) Filed: Feb. 27, 2013

(65) Prior Publication Data

US 2013/0169149 A1    Jul. 4, 2013

Related U.S. Application Data

(63) Continuation of application No. PCT/JP2011/069402, filed on Aug. 29, 2011.

(30) Foreign Application Priority Data

Aug. 31, 2010 (JP) ................. 2010-194106

(51) Int. Cl.
  *H01L 33/50* (2010.01)
  *H01L 33/54* (2010.01)
  (Continued)

(52) U.S. Cl.
  CPC ............... *H05B 33/10* (2013.01); *C09K 11/02* (2013.01); *H01L 33/502* (2013.01); *H01L 33/60* (2013.01);
  (Continued)

(58) Field of Classification Search
  CPC ................ H01L 2933/0041; H01L 33/502; F21V 3/0481
  USPC ............... 313/501–502, 512; 362/84; 257/98
  See application file for complete search history.

(56) References Cited

U.S. PATENT DOCUMENTS

2007/0164300 A1* 7/2007 Nabeta et al. .......... 257/98
2008/0054287 A1   3/2008 Oshio et al.
(Continued)

FOREIGN PATENT DOCUMENTS

JP    2005-019662 A    1/2005
JP    2005-026401 A    1/2005
(Continued)

OTHER PUBLICATIONS

International Search Report PCT/JP2011/069402 dated Sep. 20, 2011.
(Continued)

*Primary Examiner* — Karabi Guharay
(74) *Attorney, Agent, or Firm* — Foley & Lardner LLP

(57) ABSTRACT

A method for manufacturing a light emitting device having a light emitting element and a resin layer containing fluorescent material particles and a filler which reflects light comprises a fluorescent material precipitation process for precipitating the fluorescent material particles in advance of the filler. A light emitting device comprises a base body; a light emitting element mounted on an upper surface of the base body via a mounting portion; and a sealing resin for sealing the light emitting element. The sealing resin comprises: a fluorescent material-containing first layer for covering the light emitting element on and above the mounting portion, a fluorescent material-containing second layer formed on an upper surface of the base body around the mounting portion, and a filler-containing layer formed on the fluorescent material-containing second layer around the mounting portion.

11 Claims, 4 Drawing Sheets

(51) Int. Cl.
*H05B 33/10* (2006.01)
*H01L 33/60* (2010.01)
*H05B 33/04* (2006.01)
*C09K 11/02* (2006.01)
*H01L 33/48* (2010.01)

(52) U.S. Cl.
CPC .............. *H05B 33/04* (2013.01); *H01L 33/486* (2013.01); *H01L 2224/48091* (2013.01); *H01L 2224/48227* (2013.01); *H01L 2224/8592* (2013.01); *H01L 2933/0041* (2013.01); *H01L 2933/0091* (2013.01)

(56) References Cited

U.S. PATENT DOCUMENTS

| | | | |
|---|---|---|---|
| 2008/0149960 A1* | 6/2008 | Amo et al. | 257/98 |
| 2008/0218072 A1 | 9/2008 | Haruna et al. | |
| 2010/0044731 A1 | 2/2010 | Tokunaga et al. | |
| 2010/0044735 A1 | 2/2010 | Oyamada | |
| 2012/0112623 A1* | 5/2012 | Kobashi | 313/483 |

FOREIGN PATENT DOCUMENTS

| | | |
|---|---|---|
| JP | 2005-167079 A | 6/2005 |
| JP | 2008-060344 A | 3/2008 |
| JP | 2008-218511 A | 9/2008 |
| JP | 2009-043764 A | 2/2009 |
| JP | 2009-094351 A | 4/2009 |
| WO | WO-2008/043519 A1 | 4/2008 |

OTHER PUBLICATIONS

Chinese Office Action Dated Apr. 28, 2015 Issued Application No. 201180041588.X.

Extended European Search Report Dated Feb. 23, 2015 Issued in Application 11821711.6.

\* cited by examiner

LIGHT EMITTING DEVICE AND METHOD FOR MANUFACTURING A LIGHT EMITTING DEVICE

CROSS-REFERENCE TO RELATED APPLICATIONS

The present application is a continuation of PCT Application No. PCT/JP2011/069402, filed Aug. 29, 2011, which claims priority to Japanese Patent Application No. 2010-194106, filed Aug. 31, 2010. The contents of these applications are incorporated herein by reference in their entireties.

BACKGROUND OF THE INVENTION

1. Field of the Invention

The present invention relates to a light emitting device and a method for manufacturing a light emitting device.

2. Description of Related Art

A light emitting device using a semiconductor light emitting element (hereinafter simply referred to as "light emitting element") such as a light emitting diode (LED) may be used as a light source for display devices and illuminating devices. Light emitting devices using light emitting elements are attracting attention as new light sources to replace conventionally used fluorescent lights, filament lamps, and the like. Particularly, an LED has a long life in comparison with other light sources, e.g., a fluorescent light or a filament lamp, and is capable of emitting light with less energy. Therefore, the LED is largely expected to be the next-generation light source for lighting.

Demand for light emitting devices of white light is most expected. Known light emitting devices include those including light emitting elements of red light, blue light, and green light to emit white light, and those emitting white light by using a light emitting element and fluorescent materials capable of emitting complementary colored light when excited by the light emitting element. For a light emitting device used for general lighting, if the light emitting device uses the light emitting elements of colors of red, blue, and green, a color rendering property thereof is degraded. Thus, a white light emitting device using fluorescent material is preferred. More specifically, a white light emitting device using a blue light emitting element and YAG fluorescent materials is known.

A light emitting device configured by using the light emitting element and the fluorescent materials is prepared by forming a phosphor layer such that the phosphor layer covers the light emitting element. However, recently, a light emitting device provided with the light emitting element mounted in a case by using a submount has been used. In such a light emitting device, various improvements may be made in order to improve flux while preventing luminance from being degraded.

For example, a light emitting device having a configuration in which a reflective layer mixed with titanium oxide is provided around a submount mounted with a light emitting element within a resin case, and formed with a light-transmissive layer containing fluorescent material so as to cover the reflective layer and the light emitting element has been disclosed. See, e.g., Japanese Patent Publication No. 2005-026401 A.

Further, a light emitting device having a configuration in which a primary sealing member is filled around a submount mounted with a light emitting element so as to cover upper side surfaces of the light emitting element to cure the primary sealing member within a resin case and, subsequently, a secondary sealing member containing a fluorescent material is filled on the primary sealing member to forcibly precipitate the fluorescent material on an upper surface of the light emitting element and an upper surface of the primary sealing member to cure the secondary sealing member has been disclosed. See, e.g., Japanese Patent Publication No. 2008-218511 A.

The light emitting devices disclosed in, for example, Japanese Patent Publication No. 2005-026401 A and Japanese Patent Publication No. 2008-218511 A, had a problem that there occurs color unevenness and a yellow ring as the phosphor layer becomes larger with respect to a light emitting portion of the light emitting element.

To solve the above problem, forming a phosphor layer only around the light emitting element according to electrode positioning and printing have been studied. However, the electrode positioning has the following problems. Namely, a particle diameter of the fluorescent material is limited and thus classification of the fluorescent material is essential. Further, the phosphor layer is formed also on terminals and wire parts charged with an electric potential. Still further, a light emitting element specially treated so as to cause the entire light emitting element to have an electric potential becomes essential.

On the other hand, printing has the following problems. Namely, it is difficult to form the phosphor layer since the light emitting element including an electrode on an upper surface thereof requires a wire interconnection. Therefore, use of the printing is limited to a case where the light emitting element of a flip-chip assembly type is used, and a problem in printing precision is seen in the printing.

SUMMARY OF THE INVENTION

In one aspect, a method for manufacturing a light emitting device including a light emitting element and a resin layer containing fluorescent material particles and a filler which reflects light comprises a fluorescent material precipitation process for precipitating the fluorescent material particles in advance of the filler.

A light emitting device according to an aspect includes a base body, a light emitting element mounted on an upper surface of the base body via a mounting portion, and a sealing resin for sealing the light emitting element, wherein the sealing resin includes a fluorescent material-containing first layer for covering the light emitting element on and above the mounting portion, a fluorescent material-containing second layer formed on an upper surface of the base body around the mounting portion, and a filler-containing layer formed on the fluorescent material-containing second layer around the mounting portion.

A light emitting device according to another aspect includes a light emitting element configured such that a light emission structure division is bonded onto a support substrate, a base body, and a sealing resin for sealing the light emitting element, wherein the light emitting element is mounted on an upper surface of the base body so as to be opposing to the support substrate, wherein the sealing resin includes the fluorescent material-containing first layer for covering the light emitting element on and above the support substrate, the fluorescent material-containing second layer formed on the upper surface of the base body around the support substrate, and the filler-containing layer formed on the fluorescent material-containing second layer around the support substrate.

BRIEF DESCRIPTION OF THE DRAWINGS

The disclosure will become more fully understood from the following detailed description, taken in conjunction with the accompanying figures, in which.

DESCRIPTION OF THE EMBODIMENTS

Figure 1:
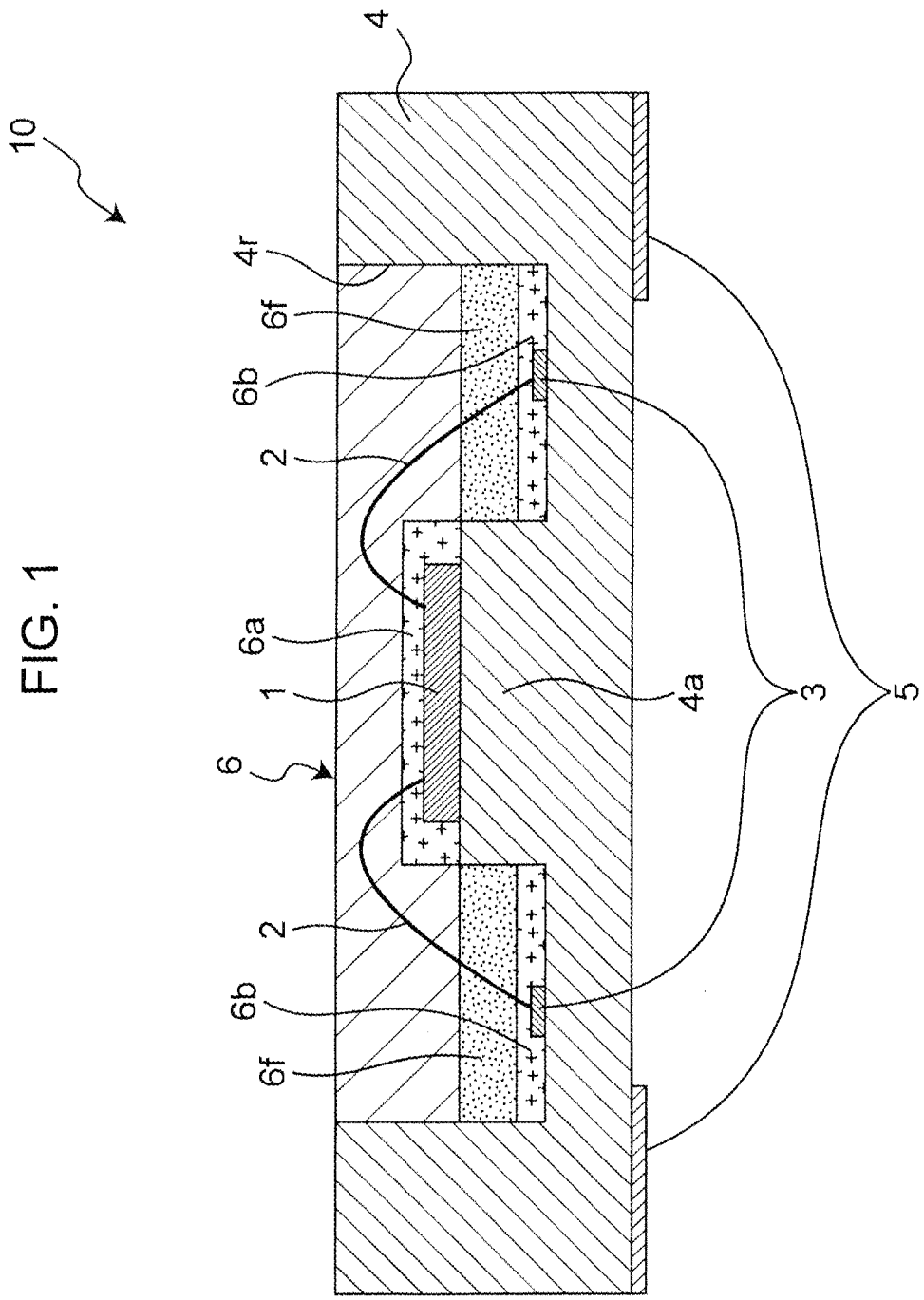
FIG. 1 is a cross sectional view of a light emitting device of a first embodiment.

Embodiments of the invention will now be described with reference to the accompanying drawings, wherein like reference numerals designate corresponding or identical elements throughout the various drawings.

However, the below mentioned embodiments are intended to illustrate exemplary light emitting devices for implementing the technical concept of the present invention, and are not intended to limit elements recited in the scope of claims to those described in the embodiments. A size, a material, and a shape of the constituent members, and a relative positioning therebetween exemplified in the embodiments are not intended to limit the scope of the present invention. The size and the positional relationship of the members illustrated in each drawing may be enlarged for the sake of clear explanation. Further, in the following description, the same titles and the same reference numbers and/or symbols indicate the same or the equivalent members and thus detailed descriptions of them are omitted.

First Embodiment

A light emitting device 10 of the first embodiment is configured to include, as illustrated in FIG. 1, a substrate 4 including a recess portion 4r, a light emitting element 1 mounted on a protruding portion (i.e., a mounting portion) 4a provided on a bottom surface (i.e., a portion of an upper surface of the substrate) of the recess portion 4r, and a sealing resin 6 disposed in the recess portion 4r to seal the light emitting element 1.

In the light emitting device 10 of the first embodiment, the sealing resin 6 has a layered structure including a fluorescent material-containing first layer 6a for covering the light emitting element 1 on and above the mounting portion 4a, a fluorescent material-containing second layer 6b formed on a side of a bottom surface of the recess portion 4r around the mounting portion 4a, and a filler-containing layer 6f formed on the fluorescent material-containing second layer 6b around the mounting portion 4a.

Each constituent member of the light emitting device 10 of the first embodiment will be described in detail below.

<Substrate 4>

The substrate 4 including the recess portion 4r is provided with the mounting portion 4a to be mounted with the light emitting element 1 at a center portion of the bottom surface of the recess portion 4r, and is formed with, for example, an annular ring-shaped second recess portion around the mounting portion 4a. Further, the bottom surface of the second recess portion (i.e., a portion of an upper surface of the substrate) is provided with two separated lead electrodes 3, and the lead electrodes 3 are connected to corresponding external connecting terminals 5.

In the substrate 4, the mounting portion 4a may be formed in one piece with a body of the base body, or may be provided with an independent submount attached thereto.

Further, the base body 4 may be a resin package or a ceramic package in which the lead electrodes 3 and the external connecting terminals 5 are formed in one piece. Alternatively, the base body 4 may be configured with a substrate as a base, including the lead electrodes 3 and the external connecting terminals 5 formed thereon.

A size, an appearance, and a shape of the recess portion of the base body 4 are selectable according to the purpose or use of the base body. For example, a rectangular shape, a polygonal shape, a circular shape, or a combination thereof may be used. Examples of a preferable material of the base body 4 include a glass-reinforced epoxy-resin, ceramic, a thermosetting resin, a thermoplastic resin, Al, and Cu. A combination of these materials, for example, a base body made of ceramic with Cu embedded therein, can be used.

<Light Emitting Element 1>

The light emitting element 1 is, for example, a semiconductor light emitting element such as a light emitting diode. The light emitting element 1 is prepared according to, for example, crystal growth of GaN onto a sapphire substrate. A light emission peak of the light emitting element 1 is set to, for example, 460 nm if the light emitting element 1 is configured in combination with the below mentioned YAG-based fluorescent material. In the light emitting device 10 illustrated in FIG. 1, the light emitting element provided with a positive electrode and a negative electrode on the upper surface of the light emitting element is illustrated. However, a flip-chip assembly type light emitting element and a light emitting element configured such that GaN is bonded to a Si substrate and electrodes are formed on both surfaces thereof may also be used. A composition, a light emission color, a size, and the number of the light emitting element are selectable, as required, according to a purpose and use thereof.

<Fluorescent Material-Containing First Layer 6a>

The fluorescent material-containing first layer 6a made of for example, a silicone-based resin mixed with the fluorescent material particles, covers the upper surface and side surfaces of the light emitting element 1 on and above the mounting portion 4a. The fluorescent material particles contained in the fluorescent material-containing first layer 6a are excited by light from the upper surface and the side surfaces of the light emitting element 1 to emit light having a wavelength different from that of the excitation light. An epoxy-based resin and a hybrid silicon-based resin can be used as the resin constituting the fluorescent material-containing first layer 6a according to a purpose or use thereof. Examples of the fluorescent material particles to be mixed include, for example, (a) a rare earth aluminate fluorescent material mainly activated by a lanthanoid-based element such as Ce and (b) a YAG-based fluorescent material, having a body color of yellow, represented by a chemical composition formula of $Y_3Al_5O_{12}$:Ce, $(Y_{0.8}Gd_{0.7})_3Al_5O_{12}$:Ce, $Y_3(Al_{0.8}Ga_{0.2})_5O_{12}$:Ce, and $(Y, Gd)_3(Al, Ga)_5O_{12}$:Ce. Fluorescent materials other than the above one but having the similar performance, action, and effect can also be used.

The fluorescent material to be mixed preferably has a specific gravity larger than that of the filler to be mixed with the filler-containing layer 6f.

<Fluorescent Material-Containing Second Layer 6b>

The fluorescent material-containing second layer 6b is made of, for example, a silicon-based resin mixed with fluorescent material particles similar to those of the fluorescent material-containing first layer 6a and is formed on the bottom surface of the second recess portion around the mounting portion 4a. An epoxy-based resin and a hybrid silicone-based resin can be used as the resin constituting the fluorescent material-containing second layer 6b according to a purpose or use thereof. However, at least the resin of the same type as the below mentioned filler-containing layer 6f is used.

<Filler-Containing Layer 6f>

The filler-containing layer 6f is made of for example, a silicone-based resin mixed with filler and covers the fluorescent material-containing second layer 6b within the second recess portion around the mounting portion 4a. The filler-containing layer 6f reflects light (including light of which wavelength is converted by the fluorescent material particles) from the light emitting element 1 to improve light extraction efficiency as well as to prevent the fluorescent material particles contained in the fluorescent material-containing second layer 6b from being excited by the light from the light emitting element 1, thereby preventing color unevenness and preventing a yellow ring from occurring. Further, the filler-containing layer 6f is preferably formed such that an upper surface of the filler-containing layer 6f has substantially the same height as an upper surface of the mounting portion 4a. Accordingly, the light (including the light of which wavelength is converted by the fluorescent material particles) emitted from the side surfaces of the light emitting element 1 can be prevented from being repetitively intricately reflected within the second recess portion, thereby preventing color unevenness from occurring.

An epoxy-based resin and a hybrid silicone-based resin can also be used as the resin constituting the filler-containing layer 6f according to the purpose or use thereof. Preferably, $TiO_2$ having improved reflectance is used as the filler. However, $SiO_2$ and $Al_2O_3$ or carbon black may also be used according to the purpose or use thereof. They may be used alone or in combination. Further, a particle diameter, density, and mixing ratio of each member are selectable, as required. However, the preferable filler to be mixed has a specific gravity smaller than that of the fluorescent material particles to be mixed with the fluorescent material-containing second layer 6b.

According to the light emitting device 10 of the first embodiment having the above configuration, without using electrode positioning and a highly precise printing technique, a light emitting device in which color unevenness and a yellow ring are prevented from occurring can be manufactured at low cost according to the below mentioned simple manufacturing method.

A method for manufacturing the light emitting device of the first embodiment will be described below.

The present manufacturing method is a method for manufacturing the light emitting device illustrated in FIG. 1 including a fluorescent material precipitation process in which an average particle diameter and an average specific gravity of the fluorescent material particles and an average particle diameter and an average specific gravity of the filler are set such that a precipitation rate of the fluorescent material particles becomes faster than a precipitation rate of the filler in an uncured resin as a fluid to allow the fluorescent material particles to precipitate preferentially to the filler within the uncured resin, thereby forming the fluorescent material-containing first layer 6a for covering the upper surface and the side surfaces of the light emitting element 1 as well as forming the fluorescent material-containing second layer 6b on a side of the bottom surface below the filler-containing layer 6f in the second recess portion around the mounting portion 4a.

More specifically, according to the present manufacturing method, the fluorescent material precipitation process to be performed subsequent to the mounting process for mounting the light emitting element 1 within the recess portion 4r of the base body 4 includes the below mentioned first resin layer forming process and second resin layer forming process.

Each process will be described below.

<Mounting Process>

Figure 2:
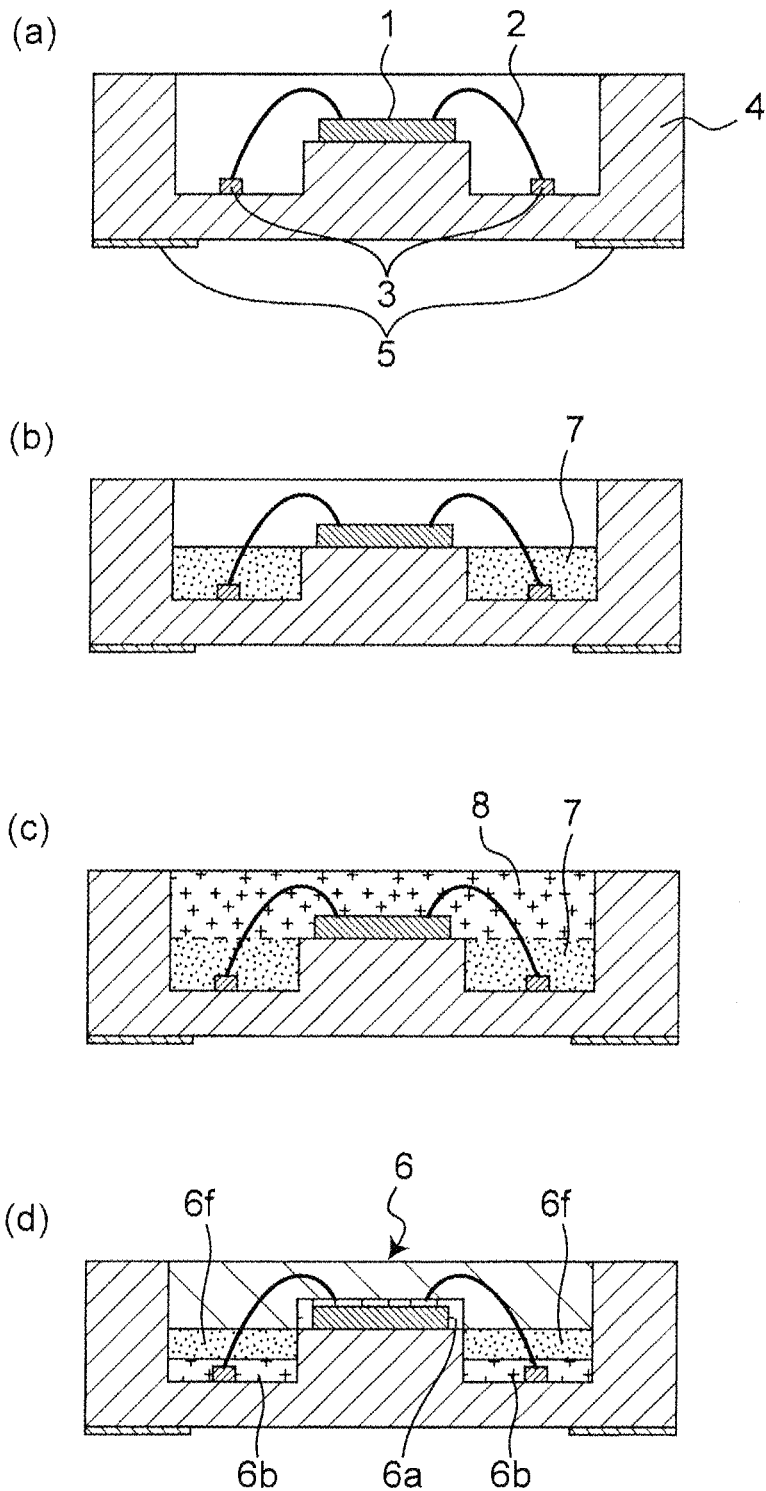
FIGS. 2A through 2D are cross sectional views illustrating a flow for manufacturing the light emitting device.

In the mounting process, the light emitting element is bonded to an upper surface of the mounting portion 4a of the base body 4 via the die-bonding and thereafter the positive electrode and the negative electrode (not illustrated) of the light emitting element are connected to the each corresponding lead electrodes 3 via wire-bonding (FIG. 2A). In FIG. 2A, bonding wires are represented by the reference numeral 2.

<First Resin Layer Forming Process>

In the first resin layer forming process, as illustrated in FIG. 2B, a first resin mixed with the filler dispersed therein is filled into the second recess portion around the mounting portion 4a within the recess portion 4r. The first resin constitutes the filler-containing layer 6f and the fluorescent material-containing second layer 6b. The filler is desirably filled up to a position lower than the upper surface of the mounting portion 4a by a range between 10 μm and 100 μm such that the filler does not cover the upper surface of the mounting portion 4a of the base body 4. The resulting first resin layer 7 comes to be a reflector shape (i.e., a recess shape) according to a creep-up phenomenon of the resin with respect to the side surfaces of the mounting portion 4a and the wall surface of the recess portion 4r of the base body 4 and a surface tension of the liquid resin.

Then, without curing the first resin, the next second resin layer forming process is performed.

<Second Resin Layer Forming Process>

In the second resin layer forming process, as illustrated in FIG. 2C, the second resin containing the fluorescent material particles are applied onto the first resin layer 7 and the light emitting element 1 to form a second resin layer 8 before curing the first resin layer 7.

<Precipitation Process of Fluorescent Material Particles>

After forming the second resin layer 8, the second resin layer 8 is left as it is, for example, at a room temperature for not less than a predetermined period of time to naturally precipitate the fluorescent material particles owing to their own weight, thereby forming the fluorescent material-containing first layer 6a for covering the upper surface and the side surfaces of the light emitting element 1 on the mounting portion 4a of the base body 4 as well as the first resin layer 7 is separated into the lower fluorescent material-containing second layer 6b and the filler-containing layer 6f substantially free from the fluorescent material particles (FIG. 2D).

The present embodiment is made focusing on such a possible precipitation of the fluorescent material that the florescent material having precipitated (i.e., dropped) at a speed accelerated by its self-weight within the second resin layer 8 displaces the filler while passing through the first resin layer 7 (i.e., the fluorescent material precipitates preferentially to the filler). This phenomenon utilizes that a resistance with respect to the drop of the fluorescent material in the second resin layer 8 is smaller than a resistance with respect to the drop of the fluorescent material in the first resin layer 7 which becomes larger due to an inclusion of the filler.

In other words, the present embodiment is made such that the precipitation process for precipitating the fluorescent material particles includes a process for precipitating the fluorescent material particles through the filler.

The filler in the first resin layer 7 may stay above the fluorescent material, e.g., may be precipitated above the fluorescent material so as to form a layer.

As described above, the present embodiment utilizes a difference of a resistance with respect to the precipitation of the fluorescent material generated according to presence or absence of the filler or a difference of content of the filler. The same resin can be used as the first resin and the second resin and, in order to form the first resin layer 7 and the second resin layer 8 into one piece. It is preferable to use the same resin as the first resin and the second resin.

In the illustration of FIG. 1, no filler is included in the fluorescent material-containing second layer 6b; however, needless to say, the filler may be contained in the fluorescent material-containing second layer 6b. Additionally, in the illustration of FIG. 1, no fluorescent material is contained in the filler-containing layer 6f; however, the fluorescent material which could not be precipitated may be contained in an area (i.e., a lower side) next to the fluorescent material-containing second layer 6b of the filler-containing layer 6f.

A period of time required for precipitating the fluorescent material particles is set based on a specific gravity and a particle diameter of the fluorescent material particles and viscosities of the first resin and the second resin. However, in consideration with a period of time required for natural curing of the resin, the period of time required for the precipitation process can be shorten by, for example, setting the specific gravity and/or the particle diameter of the fluorescent material particles larger or setting the viscosities of the first resin and the second resin lower.

As described above, being left at room temperature, the fluorescent material particles can be precipitated by their self weight; however, in order to further shorten the precipitation time, the fluorescent material particles also can be forcibly precipitated by using a swing type centrifugal machine configured to be oriented in a direction normal to the light emitting element.

<Resin Curing>

After completion of the precipitation of the fluorescent material particles, the first resin and the second resin are cured.

According to the above processes, prepared is the light emitting device 10 of the first embodiment sealed with the sealing resin 6 including the fluorescent material-containing first layer 6a for covering the upper surface and the side surfaces of the light emitting element 1 on and above the mounting portion 4a of the base body 4, the fluorescent material-containing second layer 6b, and the filler-containing layer 6f substantially free from the fluorescent material particles.

Here, it is needless to say that the sealing resin 6 is made of the first resin and the second resin.

The precipitation process of fluorescent material particles and the curing process of resin can be performed in series by controlling a program during step cure.

Setting of Specific Gravity and Particle Diameter of Fluorescent Material Particles and Specific Gravity and Particle Diameter of Filler A particle velocity of the particles to be precipitated in a fluid such as a resin before being cured in the first embodiment is, as indicated by the Stokes equation, proportional to a density (i.e., the specific gravity) of particles and square of the particle diameter of the particles, and is inversely proportional to a viscosity of a fluid.

Therefore, when considering that the specific gravity of generally used fluorescent material particles is in a range of between about 4 and 5, and a specific gravity of $TiO_2$ typically used as filler is about 4 and thus difference therebetween is not large, fluorescent material particles can substantially be preferentially precipitated within resin by, for example, causing the first resin and the second resin to have almost the same viscosity and setting an average particle diameter of the fluorescent material particles to 10 times or more, preferably 20 times or more, and more preferably 30 times or more, of an average particle diameter of the filler, i.e., by multiplying the first resin and the second resin by more than a single-digit.

Among employable florescent materials, even considering that $Ca_2Si_5N_8$:Eu fluorescent material (i.e., a nitride-based red fluorescent material) which is relatively light has a specific gravity of about 3 and $Lu_3Al_5O_{12}$ fluorescent material which is relatively heavy has a specific gravity of about 6.7, it is understandable that the fluorescent material particles can substantially be preferentially precipitated in a resin by setting the average particle diameter of the fluorescent material particles larger than the average particle diameter of the filler by a single-digit (i.e., by setting the average particle diameter of the fluorescent material particles more than 10 times as the average particle diameter of the filler).

A thickness of the fluorescent material-containing first layer 6a as a wavelength conversion layer of the light emitted by the light emitting element 1 can be set to a desired value by adjusting an amount of fluorescent material particles within the first resin and a thickness of the second resin layer 8 formed on the light emitting element 1 and the mounting portion 4a.

A thickness of a portion covering side surfaces of the light emitting element 1 of the fluorescent material-containing first layer 6a is affected by a distance from the side surfaces of the light emitting element 1 to outer peripheral edges of the mounting portion 4a. However, the distance from the side surfaces of the light emitting element 1 to the outer peripheral edges of the mounting portion 4a can be set to any distance and the thickness of the portion covering the side surfaces of the light emitting element 1 can also be adjusted with ease.

According to an aspect of the method for manufacturing the light emitting device of the first embodiment having the above configuration, the relatively thin fluorescent material-containing first layer 6a for covering the light emitting element 1 can be formed into a uniform film thickness with a simple process without using the electrode positioning and a highly precisely managed printing. As a result thereof, the light emitting device in which the color unevenness and the yellow ring are prevented from occurring can be manufactured at low cost.

According to another aspect of the light emitting device of the first embodiment having the above configuration, a light emitting device in which color unevenness and a yellow ring can be prevented from occurring can be provided at low cost.

In the above first embodiment, a case where the light emitting device is configured and prepared by using the package type base body 4 including the recess portion 4r is exemplified for the sake of description. However, the present embodiment is not limited to the above case, but can be applied to the light emitting device using a flat substrate as the base body.

A light emitting device using the substrate as the base body according to a second embodiment will be described below.

Second Embodiment

The light emitting device of the second embodiment according to the present embodiment will be described below with reference to FIG. 3.

Figure 3:
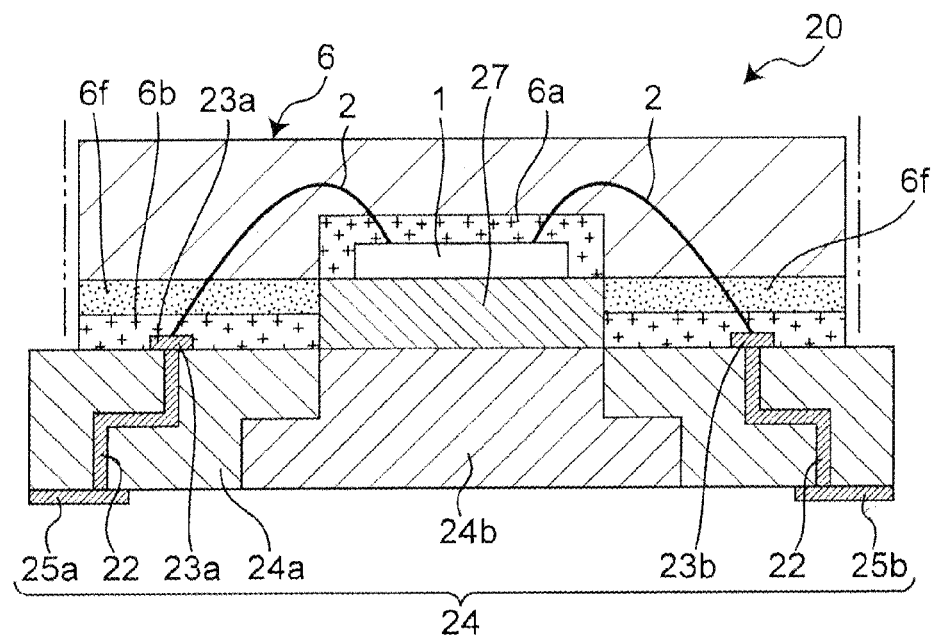
FIG. 3 is a cross sectional view of a light emitting device of a second embodiment.

In FIG. 3, members similar to those of the light emitting device of the first embodiment illustrated in FIG. 1 are provided with similar reference numbers and/or symbols and, unless otherwise noted, those members have the same configurations as those of the light emitting device of the first embodiment.

In the light emitting device of the second embodiment, a substrate 24 is configured such that, for example, a heat sink 24b and inner layer wirings 22 are embedded in a substrate base 24a made of glass epoxy and terminal electrodes 23a and 23b formed on one main surface thereof are connected to each corresponding external connecting terminals 25a and 25b formed on the other main surface via the inner layer wirings 22.

In the substrate 24, the heat sink 24b includes a first surface and a second surface faced to each other, wherein a thickness defined by a distance between the first surface and the second surface is almost equal to a thickness of the substrate base 24a.

The heat sink 24b is embedded in the substrate base 24a such that the first surface is positioned at a level almost flush with one of the main surfaces of the substrate base 24a and the second surface is positioned at a level almost flush with the other one of the main surfaces of the substrate base 24a.

With the substrate 24 having the above configuration, the light emitting element 1 is bonded onto the first surface of the heat sink 24b via a submount 27 via the die bonding and the positive electrode and the negative electrode of the light emitting element are connected to the each corresponding lead electrodes 23a and 23b via the wire bonding.

Then, a frame for enclosing the submount 27 and the light emitting element 1 is provided on the substrate 24 so as to be separated from the submount, thereby forming a resin filling portion corresponding to the recess portion 4r described in the first embodiment.

The semiconductor device of the second embodiment is prepared by going through the first resin layer forming process, the second resin layer forming process, the fluorescent material particle precipitation process, and the resin curing process as described in the first embodiment.

In the light emitting device 20 of the second embodiment prepared in a manner as described above, the sealing resin 6 has a layered structure including, similar to the first embodiment, the fluorescent material-containing first layer 6a for covering the light emitting element 1 on and above the submount 27, the fluorescent material-containing second layer 6b formed on one main surface of the substrate 24 around the submount 27, and the filler-containing layer 6f formed on the fluorescent material-containing second layer 6b around the submount 27.

Figure 6:
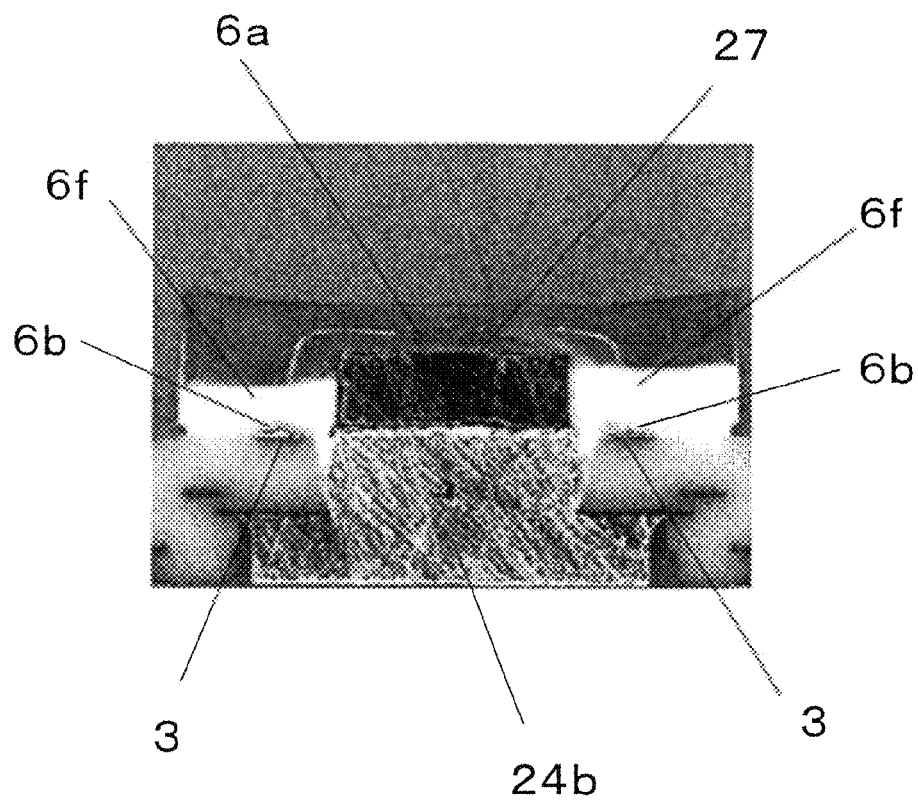
FIG. 6 is a photograph of a cross sectional view observed when the light emitting device described in the second embodiment is prepared.

FIG. 6 shows a photograph taken at a time when the light emitting device described in the second embodiment is actually prepared and a cross section thereof is observed. In the photograph, the layered structure including the fluorescent material-containing second layer 6b and the filler-containing layer 6f formed on the fluorescent material-containing second layer 6b is confirmed.

As described above, according to the light emitting device of the second embodiment having the above configuration, a light emitting device in which color unevenness and a yellow ring are prevented from occurring can be provided at low cost.

In the above first and second embodiments, it is so configured that the mounting portion 4a or the submount 27 are used and the light emitting element 1 is mounted on the mounting portion 4a or the submount 27. Further, in the light emitting element 1, since both of the positive electrode and the negative electrode are formed on a side of the light emitting surface, the mounting portion 4a or the submount 27 may have conductivity or may not have conductivity. However, the present embodiment is not limited thereto but may be so configured that, as described in the following embodiment, the light emitting element itself bonded to the support substrate may be provided on the base body.

Third Embodiment

Figure 4:
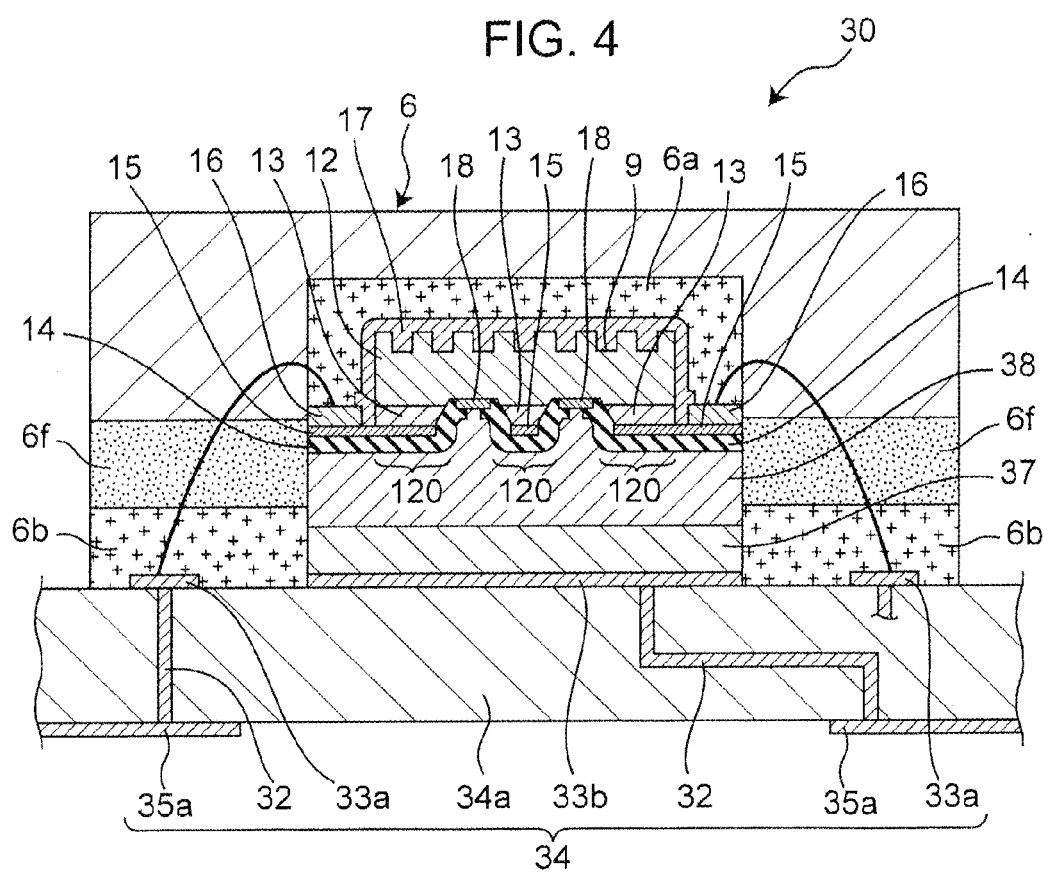
FIG. 4 is a cross sectional view of a light emitting device of a third embodiment.

FIG. 4 is a cross sectional view illustrating a configuration of a light emitting device of a third embodiment. In the light emitting device of the third embodiment, light emission structure divisions 120 are provided above a support substrate 37 via an adhesive layer 38. In the light emission structure divisions 120 of the third embodiment, a plurality of portions of a p-type layer 13 are removed and a plurality of first electrodes 18 are formed in each of the removed portions so as to allow the first electrodes 18 to contact an n-type layer 12. The plurality of first electrodes 18 may be formed separately since they are connected to each other by the adhesive member 38 having conductivity. In FIG. 4, the first electrodes 18 are illustrated as if they are separated from each other, however, the first electrodes 18 are actually electrically connected to each other. The first electrodes 18 are electrically connected to the support substrate 37 via the adhesive member 38 having conductivity.

A p-type layer 13 of each light emission structure division 120 is provided with second electrodes 15 electrically separated from the adhesive member 38 by an insulating layer 14. The support substrate 37 and the mating member 38 have the same planer shape, whereas, the light emission structure divisions, each including the p-type layer 13 and the n-type layer 12, have a planer shape smaller than that of the support substrate 37. As described above, the second electrodes 15 of the light emission structure divisions 120 disposed outside thereof are provided so as to extend to outside of the light emission structure divisions and pad electrodes 16 are formed on the second electrodes 15 extending to the outside.

In the light emitting element of the third embodiment, as illustrated in FIG. 4, an odd-shaped portion 9 is formed on a side of a light extraction surface of the n-type layer 12 to improve the light extraction efficiency, thereby improving the external quantum efficiency. Instead of the odd-shaped portion 9 or in addition to the odd-shaped portion 9, a surface of a transparent insulating film 17 may be formed into the odd-shape. Here, the odd-shaped portion 9 may have a protruding portion or a recess portion having various shapes such as a dot-shape, a lattice shape, a honeycomb shape, a branch shape, a rectangular shape, a polygonal shape, and a circular shape. The odd-shaped portion 9 can have a cross section of a rectangular shape, a trapezoidal shape, and a pyramid shape. A size of the odd-shaped portion 9 can be set as required. However, distances between an opening portion, a protruding portion, and a recess portion, a length of a side (of a rectangular shape and a polygonal shape), and a diameter (of a dot shape and a circular shape) are set specifically to a range between 1 μm and 10 μm, and more preferably a range between 2 μm and 5 μm.

The light emitting element illustrated in FIG. 4 can be prepared in the following manner.

Initially, for example, the n-type layer 12 and the p-type layers 13 made of a nitride semiconductor are laminated on a growing substrate to form a semiconductor laminated structure. Alternatively, a light emission layer may be formed between the n-type layer 12 and the p-type layer 13.

Then, the p-type layers 13 are removed at a plurality of portions to partially expose surfaces of the n-type layer 12 in order to form the first electrodes 18 thereon.

Subsequently, the first electrodes 18 are formed on thus exposed surfaces of the n-type layer 12 and the second electrodes 15 are formed on the surfaces of the p-type layers 13.

Further subsequently, insulating films 14 made of, for example, $SiO_2$ are formed on the semiconductor laminated structure. Further, the first electrodes 18 are partially exposed for the sake of electric connection with a side of the support substrate 37.

For example, a mating layer made of Ti—Pt—Au is formed.

On the other hand, for example, a mating layer of the Ti—Pt (Au of an underlayer and a bonding layer made of Sn—Au on the underlayer are formed also at a side of the support substrate 37 made of Cu—W.

The bonding layer of the side of the semiconductor laminated structure and the bonding layer of the side of the support substrate are bonded via the thermo compression bonding to mate therebetween. Thereafter, laser light is irradiated from a side of the growing substrate to remove the growing substrate and further the n-type layer 12 is formed with the odd-shaped portion 9.

Finally, the semiconductor laminated structure is partially removed via etching to cause the second electrodes 15 to be exposed to the outside thereof and, thereafter, to form the transparent insulating film 17 and the pad electrodes 16.

As described above, the light emitting element illustrated in FIG. 4 is prepared.

In the light emitting device of the third embodiment, the substrate 34 is so configured that, for example, an inner layer wirings 32 are embedded in the substrate base 34*a* made of a glass epoxy and terminal electrodes 33*a* and 33*b* formed on one main surface are connected to the each corresponding external connecting terminals 35*a* and 36*b* formed on the other main surface via the inner layer wirings 32.

With the substrate 34 having the above configuration, a side of the support substrate 37 of the light emitting element is bonded onto the terminal electrode 33*b* via the die bonding and the pad electrodes 16 of the light emitting element are connected to each corresponding terminal electrodes 33*a* via the wire bonding.

Then, the frame enclosing the light emitting element is provided away from the light emitting element to form a resin filling portion.

The semiconductor device of the third embodiment is prepared by going through the first resin layer forming process, the second resin layer forming process, the fluorescent material particle precipitation process, and the resin curing process as described in the first embodiment.

In the light emitting device 30 of the third embodiment having been prepared in a manner as described above, the sealing resin 6 has a layer structure including, similar to the first embodiment, the fluorescent material-containing first layer 6*a* for covering the light emission structure divisions above the support substrate 37 and the mating member 38, the fluorescent material-containing second layer 6*b* formed on one main surface of the substrate 34 around the support substrate 37 and the mating member 38, and the filler-containing layer 6*f* formed on the fluorescent material-containing second layer 6*b* around the support substrate 37 and the mating member 38.

The light emitting device of the third embodiment having the above configuration can provide a light emitting device in which the color unevenness and the yellow ring are prevented from occurring can be provided at low cost.

Fourth Embodiment

Figure 5:
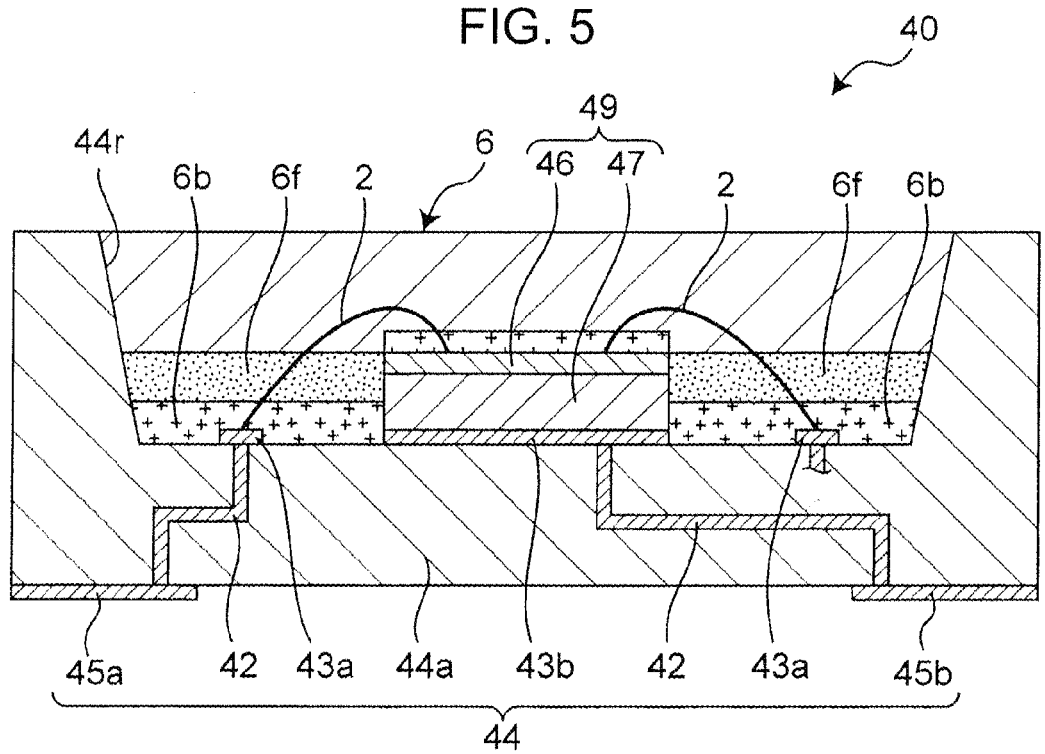
FIG. 5 is a cross sectional view of a light emitting device of a fourth embodiment.

FIG. 5 illustrates a cross sectional view illustrating a configuration of a light emitting device 40 of a fourth embodiment. The light emitting device of the fourth embodiment differs in configuration from the light emitting device of the third embodiment in the following points.

The light emitting element of the third embodiment is identical to the light emitting element of the fourth embodiment in that the growing substrate is debonded and the other support substrate is bonded instead thereof. However, the light emitting element of the third embodiment differs from the light emitting element of the fourth embodiment in that the first electrode and the second electrode are extracted from a side of one surface of the light emission structure division in the third embodiment, whereas the first electrode is formed on a side of one surface of the light emission structure division and the second electrode is formed on a side of the other surface in the fourth embodiment.

Further, the light emitting device 40 of the fourth embodiment differs from that of the third embodiment in that the light emitting device 40 of the fourth embodiment uses a package 44 including a recess portion 44*r* instead of the substrate 34 of the third embodiment.

The package 44 of the fourth embodiment differs from the substrate (i.e., package) 4 of the first embodiment in that the package 44 of the fourth embodiment does not include the mounting portion 4*a* on the bottom surface of the recess portion 44*r*.

In other words, in the light emitting device 40 of the fourth embodiment, instead of the mounting portion 4*a*, the support substrate 47 bonded to the light emitting element 49 keeps the light emission structure division 46 at an essential height.

In the light emitting device 40 of the fourth embodiment, a side wall of the recess portion 44*r* incline so as to spread upwardly to improve the upward light extraction efficiency.

More specifically, the light emitting element 49 of the fourth embodiment is prepared in a manner as follows.

Initially, a semiconductor growing substrate such as sapphire is provided with an n-type semiconductor layer, a light emission layer, and a p-type semiconductor layer laminated thereon in this order to form a semiconductor laminated structure.

Then, a p-side electrode and a metallization layer are sequentially formed on a surface of the p-type semiconductor layer.

In parallel with the above process, the metallization layer is formed on the support substrate 47, the support substrate 47 formed with the metallization layer is turned over and the metallization layer of a side of the support substrate 47 is bonded to the metallization layer of a side of the semiconductor laminated structure. Then, the semiconductor growing substrate is separated from the semiconductor laminated structure and an n-side electrode is formed on a surface of the n-type semiconductor layer exposed because of the separation.

As described above, the light emitting element 49 of the fourth embodiment having such a configuration that the light emission structure division 46 is bonded to the support substrate 47. In the light emitting element 49 of the fourth embodiment, the n-side electrode is a partial electrode and light is emitted from a portion where no n-side electrode is formed.

For example, a semiconductor substrate made of a semiconductor such as silicon (Si), Ge, and SiC, elemental metal substrate, or a metal substrate made of a complex comprising two or more metals which are immiscible to each other or which have small solubility limit can be used as the support substrate. Among those, specifically, Cu can be used as the elemental metal substrate. Specific examples of the material of the metal substrate include a complex comprising one or more metals selected from metals having high conductivity such as Ag, Cu, Au, and Pt and more one or more metals selected from metals having high hardness such as W, Mo, Cr, and Ni. If the substrate of the semiconductor material is used, an elemental function such as a zener diode can be added to the substrate of the semiconductor material. A complex of Cu—W or Cu—Mo is preferably used as the metal substrate.

In the light emitting device 40 of the fourth embodiment, the package 44 including the recess portion 44r is used as the substrate. The package 44 of the fourth embodiment differs from the substrate 4 of the first embodiment in that no mounting portion is provided on the bottom surface of the recess portion 44r. However, except for the above point, the package 44 of the fourth embodiment has a configuration basically identical to that of the substrate 4 of the first embodiment.

In the light emitting device 40 of the fourth embodiment, the package 44 is so configured that, for example, inner layer wirings 42 are embedded in a package base 44a made of resin or ceramic and terminal electrodes 43a and 43b formed on the bottom surface of the recess portion 44r are connected to each corresponding external connecting terminals 45a and 45b formed on a mounting surface via the inner layer wirings 42.

With the light emitting element 49 and the package 44 having the above configuration, a side of a support substrate 47 of the light emitting element 49 is bonded onto the terminal electrode 43b via the die bonding and the electrodes formed on a side of the light emitting surface of the light emitting element 49 are connected to the terminal electrodes 43a via the wire bonding.

Then, the semiconductor device of the third embodiment is prepared by going through the first resin layer forming process, the second resin layer forming process, the fluorescent material particle precipitation process, and the resin curing process described in the first embodiment.

In the light emitting device 40 of the fourth embodiment prepared in a manner as described above, similar to the first embodiment, the sealing resin 6 has a layered structure including the fluorescent material-containing first layer 6a for covering the light emission structure division 46 on the support substrate 47, the fluorescent material-containing second layer 6b formed on the bottom surface of the recess portion 44r around the support substrate 47, and the filler-containing layer 6f formed on the fluorescent material-containing second layer 6b around the support substrate 47.

According to the light emitting device of the fourth embodiment having the above configuration, the light emitting device in which the color unevenness and the yellow ring are prevented from occurring can be provided at low cost.

Similar to the above third and fourth embodiments, the present embodiment may be configured so that, without using the submount provided on the substrate or in the recess portion of the package, the light emitting element including the light emission structure division bonded to the support substrate or the like may be provided on the substrate.

Further, in the present embodiment, any combination can be used between the substrate and the light emitting element. For example, the combination may be a combination of the substrate 34 of the third embodiment and the light emitting element 49 of the fourth embodiment or may be a combination of the package 44 of the fourth embodiment and the light emitting element including the light emission structure divisions on the support substrate 37 of the third embodiment.

The light emitting devices according to the above combinations also have the similar effect as the effect of the light emitting devices of the first through fourth embodiments.

EXAMPLE 1

As Example 1, the light emitting device is prepared in a manner as described below.

In Example 1, the below mentioned resin, fluorescent material particles, and filler are used:

(1) Resin (common to the first resin and the second resin)
Kind: dimethyl-based silicone resin
Viscosity: 3.5 through 3.9 Pa·s
(2) Fluorescent material particles
Composition: $(Y, Gd)_3Al_5O_{12}:Ce$
Specific gravity: 4.68
Average particle diameter: 15 μm
Center particle diameter: 24 μm
(3) Filler
Composition: $TiO_2$
Specific gravity: 3.9 through 4.2
Average particle diameter: 0.25 μm In Example 1, the light emitting element was first mounted on the substrate formed with lead electrodes via the submount, and the positive electrode and the negative electrode formed on the upper surface of the light emitting element were connected to the each corresponding lead electrodes via the wire bonding.

Then, the frame enclosing the submount and the light emitting element was separated from the submount and was provided on the substrate to form the resin filling portion.

Subsequently, the first resin containing the resin mixed with the filler dispersed therein was filled into a portion corresponding to the second recess portion around the submount in the resin filled portion. A mixing ratio (i.e., a ratio by weight) of the filler and the resin in the first resin was set to resin:filler (equal to 100:33). In this filling process, the first resin was filled up to a position lower than the upper surface of the submount by 100 μm.

Then, without curing the first resin, the second resin containing the fluorescent material particles dispersed therein, as similar to the first resin, is tilled onto the first resin layer and into the frame on the light emitting element 1 to form the second resin layer. Thereafter, the fluorescent material particles were naturally precipitated at a temperature of 30° C. for 3 hours.

A mixing ratio (weight ratio) between the fluorescent material particles and the resin in the second resin was set to resin:fluorescent material (equal to 100:25).

Finally, the resin was cured under the conditions of temperature of 50° C. for 3 hours and further under the conditions of raised temperature at 180° C. for 2 hours, and then the frame was removed.

The light emitting device of Example 1 was produced in the same manner as described above, thus making it possible to manufacture a light emitting device in which color unevenness and a yellow ring are prevented from occurring.

What is claimed is:
1. A light emitting device comprising:
a base body;
a light emitting element mounted on an upper surface of the base body via a mounting portion; and
a sealing resin for sealing the light emitting element,
wherein the sealing resin comprises:
a fluorescent material-containing first layer for covering the light emitting element on and above the mounting portion,
a fluorescent material-containing second layer formed on an upper surface of the base body around the mounting portion, and
a filler-containing layer formed on the fluorescent material-containing second layer laterally around the mounting portion,
wherein a top of the fluorescent material-containing first layer is exposed from the filler-containing layer.

2. The light emitting device according to claim 1, wherein an average particle diameter of the fluorescent material particles is 10 times or more than an average particle diameter of the filler.

3. The light emitting device according to claim 1, wherein the base body comprises a recess portion, and the mounting portion protrudes from a bottom surface of the recess portion.

4. The light emitting device according to claim 3, wherein the base body and the mounting portion are formed in one piece.

5. The light emitting device according to claim 3, wherein an upper surface of the filler-containing layer is at substantially a same height as an upper surface of the mounting portion.

6. The light emitting device according to claim 1, wherein the fluorescent material-containing first layer comprises at least one of a silicone-based resin, an epoxy resin, and a hybrid silicone-based resin.

7. The light emitting device according to claim 1, wherein the filler comprises at least one of $TiO_2$, $SiO_2$, $Al_2O_3$, and carbon black.

8. A light emitting device comprising:
   a light emitting element comprising a light emission structure division bonded onto a support substrate,
   a base body; and
   a sealing resin for sealing the light emitting element,
   wherein the light emitting element is mounted on an upper surface of the base body so that the support substrate opposes the upper surface of the base body, and
   wherein the sealing resin comprises:
      a fluorescent material-containing first layer for covering the light emitting element on and above the support substrate,
      a fluorescent material-containing second layer formed on the upper surface of the base body around the support substrate, and
      a filler-containing layer formed on the fluorescent material-containing second layer laterally around the support substrate,
      wherein a top of the fluorescent material-containing first layer is exposed from the filler-containing layer.

9. The light emitting device according to claim 8, wherein an average particle diameter of the fluorescent material particles is 10 times or more of an average particle diameter of the filler.

10. The light emitting device according to claim 8, wherein the a fluorescent material-containing first layer comprises at least one of a silicone-based resin, an epoxy resin, and a hybrid silicone-based resin.

11. The light emitting device according to claim 8, wherein the filler comprises at least one of $TiO_2$, $SiO_2$, $Al_2O_3$, and carbon black.

* * * * *